United States Patent
Lee et al.

(10) Patent No.: US 9,733,671 B2
(45) Date of Patent: Aug. 15, 2017

(54) FLEXIBLE DISPLAY APPARATUS

(71) Applicant: Samsung Display Co., Ltd., Yongin, Gyeonggi-Do (KR)

(72) Inventors: Kang-Won Lee, Seoul (KR); Man-Sik Myeong, Seoul (KR); Kyu-Young Kim, Suwon-si (KR); Tae-Hyeog Jung, Hwaseong-si (KR)

(73) Assignee: SAMSUNG DISPLAY CO., LTD., Gyeonggi-Do (KR)

(*) Notice: Subject to any disclaimer, the term of this patent is extended or adjusted under 35 U.S.C. 154(b) by 145 days.

(21) Appl. No.: 14/519,283

(22) Filed: Oct. 21, 2014

(65) Prior Publication Data

US 2015/0220117 A1    Aug. 6, 2015

(30) Foreign Application Priority Data

Feb. 5, 2014    (KR) .................... 10-2014-0012828

(51) Int. Cl.
 *G06F 1/16* (2006.01)
 *H05K 1/02* (2006.01)
 *H05K 5/00* (2006.01)

(52) U.S. Cl.
 CPC ............ *G06F 1/1641* (2013.01); *G06F 1/169* (2013.01); *G06F 1/1652* (2013.01); *H05K 1/028* (2013.01); *H05K 1/0272* (2013.01); *H05K 5/0017* (2013.01)

(58) Field of Classification Search
 CPC ...... G06F 1/1641; G06F 1/1652; G06F 1/169; G06F 2203/04102; H05K 1/0272; H05K 1/028; H05K 5/0017; G09G 2380/02

USPC ................................... 345/173, 204, 55–108
See application file for complete search history.

(56) References Cited

U.S. PATENT DOCUMENTS

| | | | |
|---|---|---|---|
| 7,532,389 B2* | 5/2009 | Li ........................... | C07F 7/045 345/107 |
| 8,199,272 B2 | 6/2012 | Wang et al. | |
| 8,395,704 B2 | 3/2013 | Verstegen et al. | |
| 8,866,641 B2* | 10/2014 | Caine ...................... | H04M 1/23 341/21 |
| 2007/0182718 A1* | 8/2007 | Schoener ............... | B60K 35/00 345/173 |
| 2009/0174687 A1 | 7/2009 | Ciesla et al. | |
| 2010/0171719 A1 | 7/2010 | Craig et al. | |
| 2010/0201603 A1 | 8/2010 | Kee et al. | |
| 2011/0012852 A1* | 1/2011 | Takahashi .......... | G02F 1/13338 345/173 |

(Continued)

FOREIGN PATENT DOCUMENTS

| | | |
|---|---|---|
| JP | 2011-085740 A | 4/2011 |
| KR | 1020060008583 A | 1/2008 |

(Continued)

*Primary Examiner* — Stephen Sherman
(74) *Attorney, Agent, or Firm* — Cantor Colburn LLP

(57) ABSTRACT

A flexible display apparatus is disclosed. The flexible display apparatus includes a display panel, a cover substrate, a first receiving portion and a first fluid. The display panel includes a first region and a second region surrounding at least one sides of the first region. The cover substrate is disposed over the display panel. The first receiving portion is disposed between the display panel and the cover substrate. The first receiving portion overlaps the first region of the display panel and has an empty space. The first fluid is disposed in the first receiving portion.

19 Claims, 10 Drawing Sheets

(56) References Cited

U.S. PATENT DOCUMENTS

| | | | | |
|---|---|---|---|---|
| 2011/0210937 | A1* | 9/2011 | Kee | G06F 3/041 |
| | | | | 345/174 |
| 2012/0192466 | A1* | 8/2012 | Kee | H04M 1/0266 |
| | | | | 40/1 |
| 2013/0050608 | A1 | 2/2013 | Hu et al. | |
| 2014/0320396 | A1* | 10/2014 | Modarres | G06F 3/0412 |
| | | | | 345/156 |

FOREIGN PATENT DOCUMENTS

| | | |
|---|---|---|
| KR | 1020080004982 A | 1/2008 |
| KR | 10-0822186 B1 | 4/2008 |
| KR | 1020090115523 A | 11/2009 |
| KR | 1020110106539 A | 9/2011 |
| KR | 10-1097826 B1 | 12/2011 |

\* cited by examiner

FLEXIBLE DISPLAY APPARATUS

This application claims priority to Korean Patent Application No. 10-2014-0012828 filed on Feb. 5, 2014, and all the benefits accruing therefrom under 35 USC §119, the disclosures of which are herein incorporated by reference in their entireties.

BACKGROUND

1. Field

Exemplary embodiments relate to a flexible display apparatus. More particularly, exemplary embodiments relate to a flexible display apparatus having an improved mechanical reliability.

2. Description of the Related Art

Due to the advancement of electronic technologies, various types of display apparatuses are being developed. Especially, display apparatuses such as a television ("TV"), personal computer ("PC"), laptop computer, tablet PC, mobile phone and MP3 player etc. are widely available and are in use in most households. However, efforts are being made to develop new types of display apparatuses in order to address needs of users who want even more new and various functions, so called next-generation displays.

SUMMARY

In a flexible display apparatus, where a user may change a shape thereof by applying a force thereto, the flexible display apparatus may be damaged by the user. If a material having a relatively high mechanical strength is used in the flexible display apparatus, the flexible display apparatus may not have a predetermined flexibility for changing the shape thereof. Accordingly, there is a need for a flexible display apparatus having an improved mechanical reliability and flexibility One or more exemplary embodiment provides a flexible display apparatus having an improved mechanical reliability.

According to an exemplary embodiment, there is provided a flexible display apparatus. The flexible display apparatus includes a display panel, a cover substrate, a first receiving space portion and a first fluid. The display panel includes a first region, and a second region surrounding a side of the first region. The cover substrate is over the display panel. The first receiving space portion is between the display panel and the cover substrate. The first receiving space portion overlaps the first region of the display panel. The first fluid is in the first receiving space portion.

In exemplary embodiments, the flexible display apparatus may further include a second receiving space portion and a pump between the first receiving space portion and the second receiving space portion, such that the first receiving space portion is fluid-communicated with the second receiving space portion.

In exemplary embodiments, the pump may control a movement of the first fluid between the first receiving space portion and the second receiving space portion.

In exemplary embodiments, for an unfolded state of the flexible display apparatus, the pump may transfer the first fluid from the second receiving space portion to the first receiving space portion. For a folded state of the flexible display apparatus, the pump may transfer the first fluid from the first receiving space portion to the second receiving space portion.

In exemplary embodiments, in an unfolded state of the flexible display apparatus, the pump may control a pressure of the first fluid in the first receiving space portion.

In exemplary embodiments, the second receiving space portion may overlap the second region of the display panel.

In exemplary embodiments, the first fluid may have a dielectric constant in a range from about 1.45 to about 1.55.

In exemplary embodiments, the first fluid may be a smart fluid, of which a viscosity is changeable depending on an electric field or a magnetic field applied thereto.

In exemplary embodiments, the first fluid may include a magnetic fluid, a magneto-rheological fluid or an electro-rheological fluid.

In exemplary embodiments, in an unfolded state of the flexible display apparatus, the first fluid may have a first viscosity. In a folded state of the flexible display apparatus, the first fluid may have a second viscosity lower than the first viscosity.

In exemplary embodiments, the flexible display apparatus may further include an electrode between the first receiving space portion and the display panel or between the first receiving space portion and the cover substrate. The electrode may be configured to apply the electric field or the magnetic field to the first fluid based on an unfolded state or a folded state of the flexible display apparatus.

In exemplary embodiments, the flexible display apparatus may further include a touch panel between the display panel and the first receiving space portion.

In exemplary embodiments, the touch panel may include a plurality of sensing electrodes. The plurality of sensing electrodes may be configured to apply the electric field or the magnetic field to the first fluid based on an unfolded state or a folded state of the flexible display apparatus.

In exemplary embodiments, the flexible display apparatus may further include a touch panel between the first receiving space portion and the cover substrate, a third receiving space portion defined between the touch panel and the cover substrate and a second fluid in the third receiving space portion. The third receiving space portion may overlap the first region of the display panel.

In exemplary embodiments, the flexible display apparatus may have a folding axis. The first receiving space portion may overlap the folding axis.

In exemplary embodiments, the first region may be divided into a third region adjacent to the folding axis and a fourth region spaced apart from the folding axis. The first receiving space portion may overlap the third region and expose the fourth region.

In exemplary embodiments, the flexible display apparatus may further include a second receiving space portion defined therein; and a pump between the first receiving space portion and the second receiving space portion, such that the first receiving space portion is fluid-communicated with the second receiving space portion via the pump. The second receiving space portion may overlap the fourth region and expose the third region.

In exemplary embodiments, the flexible display apparatus may have a folding axis extended in a first direction. The first receiving space portion may have a comb shape having a plurality of protruding portions extending in the first direction.

In exemplary embodiments, the flexible display apparatus may further include an adhesion layer between the display panel and the cover substrate. The adhesion layer may define the first receiving space portion.

According to one or more exemplary embodiment, a flexible display apparatus includes a display panel, a cover substrate, a first receiving space portion defined therebetween, and a fluid in the first receiving space portion. The fluid in the first receiving space portion may be transferred to a second receiving space portion defined in the flexible display apparatus when the flexible display panel is folded or rolled from an unfolded state. Therefore, the first receiving space portion may relieve a stress applied to the cover substrate or the display panel.

BRIEF DESCRIPTION OF THE DRAWINGS

Exemplary embodiments can be understood in more detail from the following description taken in conjunction with the accompanying drawings, in which.

DETAILED DESCRIPTION

Figure 1:
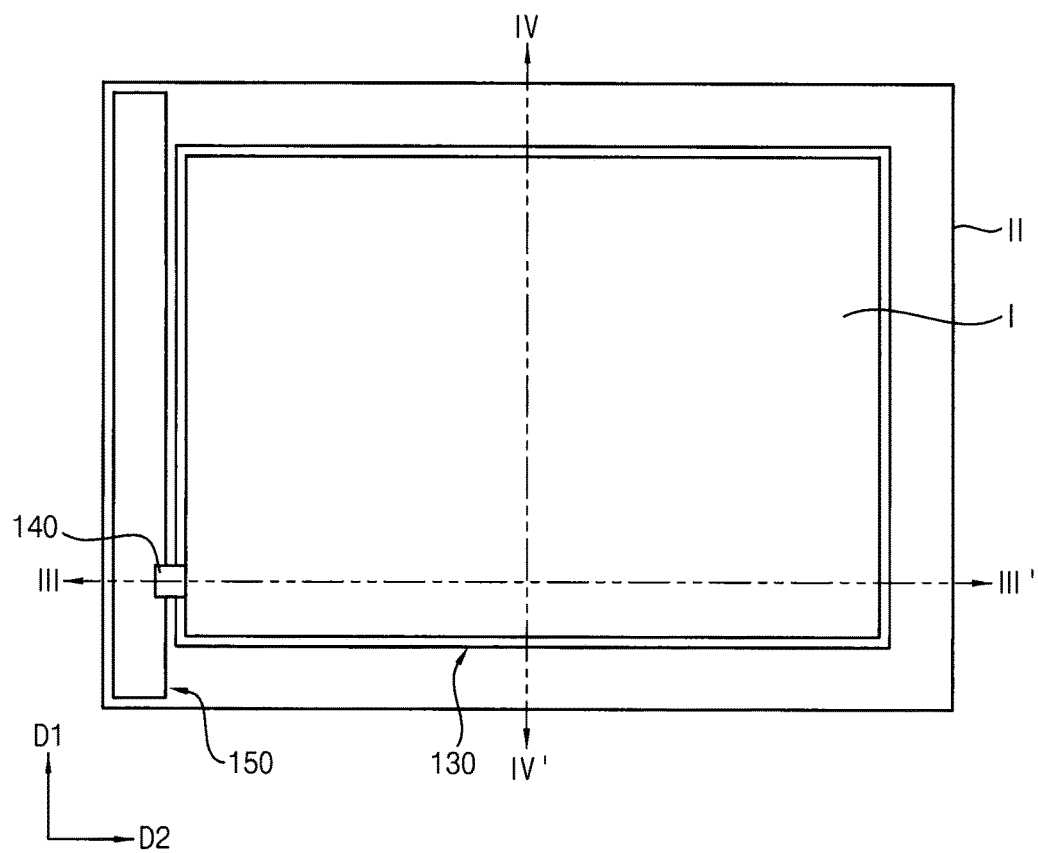
FIG. 1 is a plan view illustrating an exemplary embodiment of a flexible display apparatus in accordance with the invention.

The exemplary embodiments are described more fully hereinafter with reference to the accompanying drawings. The invention may, however, be embodied in many different forms and should not be construed as limited to the exemplary embodiments set forth herein. In the drawings, the sizes and relative sizes of layers and regions may be exaggerated for clarity.

It will be understood that when an element or layer is referred to as being "on," "connected to" or "coupled to" another element or layer, it can be directly on, connected or coupled to the other element or layer or intervening elements or layers may be present. In contrast, when an element is referred to as being "directly on," "directly connected to" or "directly coupled to" another element or layer, there are no intervening elements or layers present. As used herein, connected may refer to elements being physically, electrically and/or fluidly connected to each other. Like numbers refer to like elements throughout. Like or similar reference numerals refer to like or similar elements throughout. As used herein, the term "and/or" includes any and all combinations of one or more of the associated listed items.

It will be understood that, although the terms first, second, third etc. may be used herein to describe various elements, components, regions, layers, patterns and/or sections, these elements, components, regions, layers, patterns and/or sections should not be limited by these terms. These terms are only used to distinguish one element, component, region, layer pattern or section from another region, layer, pattern or section. Thus, a first element, component, region, layer or section discussed below could be termed a second element, component, region, layer or section without departing from the teachings of exemplary embodiments.

Spatially relative terms, such as "under," "above" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "under" other elements or features would then be oriented "above" the other elements or features. Thus, the exemplary term "under" can encompass both an orientation of above and below. The device may be otherwise oriented (rotated 90 degrees or at other orientations) and the spatially relative descriptors used herein interpreted accordingly.

The terminology used herein is for the purpose of describing particular exemplary embodiments only and is not intended to be limiting of the invention. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of illustratively idealized exemplary embodiments (and intermediate structures) of the invention. As such, variations from the shapes of the illustrations as a result, for example, of manufacturing techniques and/or tolerances, are to be expected. Thus, exemplary embodiments should not be construed as limited to the particular shapes of regions illustrated herein but are to include deviations in shapes that result, for example, from manufacturing. The regions illustrated in the figures are schematic in nature and their shapes are not intended to illustrate the actual shape of a region of a device and are not intended to limit the scope of the invention.

"About" or "approximately" as used herein is inclusive of the stated value and means within an acceptable range of deviation for the particular value as determined by one of ordinary skill in the art, considering the measurement in question and the error associated with measurement of the particular quantity (i.e., the limitations of the measurement system). For example, "about" can mean within one or more standard deviations, or within ±30%, 20%, 10%, 5% of the stated value.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Hereinafter, the invention will be described in detail with reference to the accompanying drawings.

Figure 2:
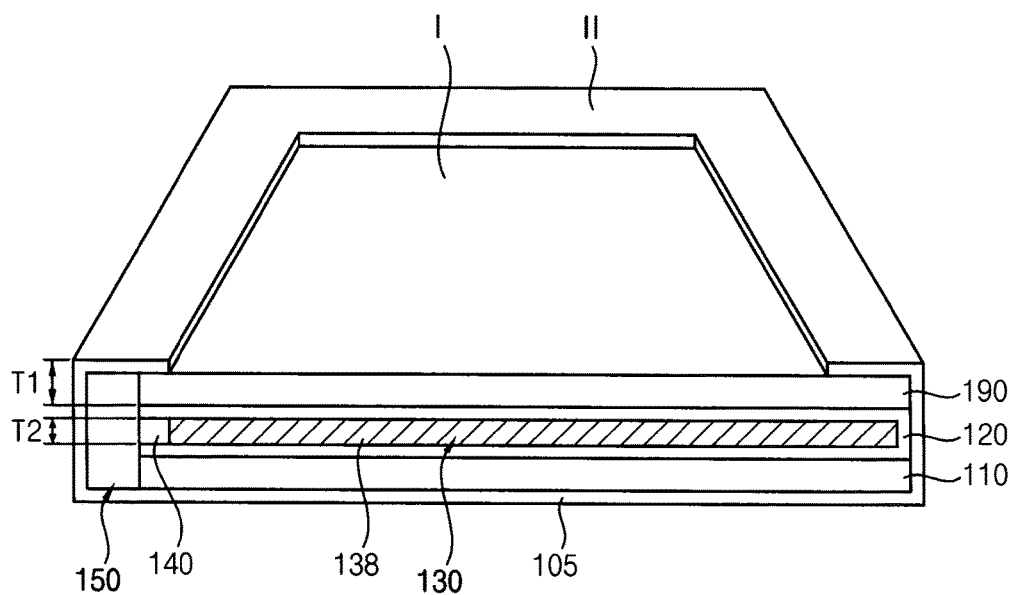
FIG. 2 is a cross-sectional perspective view taken along line III-III' in FIG. 1.

FIG. 1 is a plan view illustrating an exemplary embodiment of a flexible display apparatus in accordance with the invention, and FIG. 2 is a cross-sectional perspective view taken along line III-III' in FIG. 1.

Referring to FIGS. 1 and 2, the flexible display apparatus includes a display panel 110, a cover substrate 190, a first adhesion layer 120, a first receiving portion 130, a first fluid member 138 (also referred to herein as a "first fluid"), a first pump 140, a second receiving portion 150 and a frame 105.

The display panel 110 may include a flexible flat display panel having a predetermined flexibility. In exemplary embodiments, the display panel 110 may include a liquid crystal display ("LCD") panel, plasma display panel ("PDP"), organic light emitting diode ("OLED") panel, field emission display ("FED") panel, an electrophoretic display panel, light emitting diode ("LED") panel, etc. Further, the display panel 110 may be a top emission type display as illustrated in FIGS. 1 and 2. However, the display panel 110 of the invention is not limited thereto. In an exemplary embodiment, for example, the display panel 110 may be a bottom emission type or both a top and bottom emission type display The display panel 110 may be bent or deformed depending on external forces applied thereto such as from a user. In exemplary embodiments, the display panel 110 may be bent about a folding axis IV-IV' indicated in FIGS. 1 and 2. Alternatively, the display panel 110 may be bent about another folding axis extending in a different direction than that of folding axis IV-IV'.

The display panel 110 may be divided in a first region I, and a second region II surrounding at least one side of the first region I in the plan view. In exemplary embodiments, the first region I may be a display region in which a display pixel may be disposed, and the second region II may be a peripheral (non-display) region in which a driving circuit and a wiring may be disposed. In an exemplary embodiment, for example, the second region II may surround each of four sides of the first region I in the plan view.

In exemplary embodiments, a polarizing film and/or a touch panel may be further disposed on and/or inside the display panel 110. That is, the display panel 110 may have an in-cell structure or an on-cell structure depending on whether an element of the display apparatus is disposed inside or on the display panel 110.

The cover substrate 190 may be disposed over the display panel 110. That is, the cover substrate 190 may cover (e.g., overlap) an emission face of the display panel 110. In an exemplary embodiment, for example, the cover substrate 190 may include a transparent polymer material and may have a predetermined flexibility. The cover substrate 190 may protect the display apparatus and/or the display panel 110 from an external impact thereto. Further, the cover substrate 190 may have a first cross-sectional thickness T1 taken in a direction normal to a plane of a portion of the cover substrate 190 for which the first thickness is defined.

The first adhesion layer 120 may be disposed between the display panel 110 and the cover substrate 190. The first adhesion layer 120 may serve to hold the display panel 110 and the cover substrate 190 in a position with respect to each other and/or other elements within the display apparatus. In an exemplary embodiment, for example, the first adhesion layer 120 may include pressure sensitive adhesion ("PSA") such as rubber based adhesives, acrylic based adhesives, vinyl ether based adhesives, silicone-based adhesives, urethane adhesives, etc.

Further, a space in the first adhesion layer 120 may be defined as a first receiving portion 130. That is, portions of the first adhesion layer 120 may sufficiently surround the first receiving portion 130 and define the first receiving portion 130. Therefore, the first receiving portion 130 may receive the first fluid 138 as necessary. In order to support a shape of the first receiving portion 130, an additional member may be further disposed between the first adhesion layer 120 and the first receiving portion 130.

The first receiving portion 130 may be disposed between the display panel 110 and the cover substrate 190. In exemplary embodiments, the first receiving portion 130 may entirely overlap the first region I of the display panel 110 as illustrated in FIG. 1. Therefore, the first receiving portion 130 may also overlap the folding axis IV-IV'.

In exemplary embodiments, the first receiving portion 130 may have a second cross-sectional thickness T2. The second cross-sectional thickness T2 of the first receiving portion 130 may be smaller than the first cross-sectional thickness T1 of the cover substrate 190 or a cross-sectional thickness of the display panel 110.

The second receiving portion 150 may be disposed to be distinguished (e.g., separated) from the first receiving portion 130. The second receiving portion 150 may define an empty space for receiving the first fluid 138, along with the first adhesion layer 120. In exemplary embodiments, the second receiving portion 150 may overlap the second region II of the display panel 110. Therefore, the second receiving portion 150 may not overlap the folding axis IV-IV'.

The first pump 140 may be disposed between the display panel 110 and the cover substrate 190 in the second region II of the display panel 110. In exemplary embodiments, the first pump 140 may be a micro pump provided by ThinXXS Microtechnology AG or Bartels Mikrotechnik AG. However, the first pump 140 may include any other structure that may control a movement of a fluid.

The first pump 140 may be disposed between the first receiving portion 130 and the second receiving portion 150. That is, one end portion of the first pump 140 may be fluid-communicated with the first receiving portion 130, and an opposing other end portion of the first pump 140 may be fluid-communicated with the second receiving portion 150. In exemplary embodiments, the first pump 140 may control the movement of the first fluid 138 depending on an electrical signal or a mechanical signal provided thereto. That is, the first pump 140 may control the movement of the first fluid 138 between the first receiving portion 130 and the second receiving portion 150.

The first fluid 138 may be disposed in the first receiving portion 130 and/or the second receiving portion 150 depending on the operation of the display apparatus. The first fluid 138 may be a liquid, a gas, a gel or an aerogel having a predetermined viscosity. The first fluid 138 may be determined in the light of dielectric constants of the display panel 110, the cover substrate 190 and/or the first adhesion layer 120. In exemplary embodiments, the first fluid 138 may have a dielectric constant in a range of about 1.45 to about 1.55. Therefore, the first fluid 138 may not be recognized by the user. The function of the first fluid 138 will be described with reference to FIGS. 3 and 4 as follow.

The frame 105 may receive the display panel 110 and the cover substrate 190. In exemplary embodiments, the frame 105 may cover the second region II of the display panel 110, and may expose the first region I of the display panel 110. Therefore, the first region I of the display panel 110 may be exposed to the user and may include a display area of the display apparatus.

Figure 3:
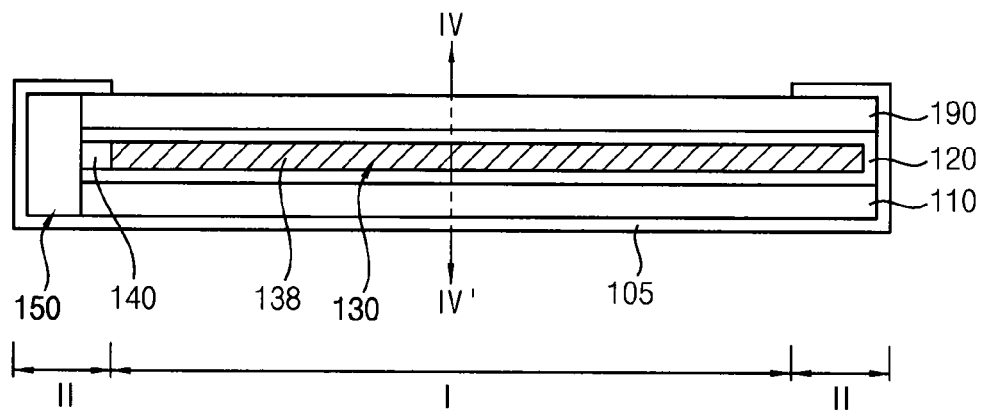
FIGS. 3 and 4 are cross-sectional views illustrating an operating method of an exemplary embodiment of a flexible display apparatus in accordance with the invention.
Figure 4:
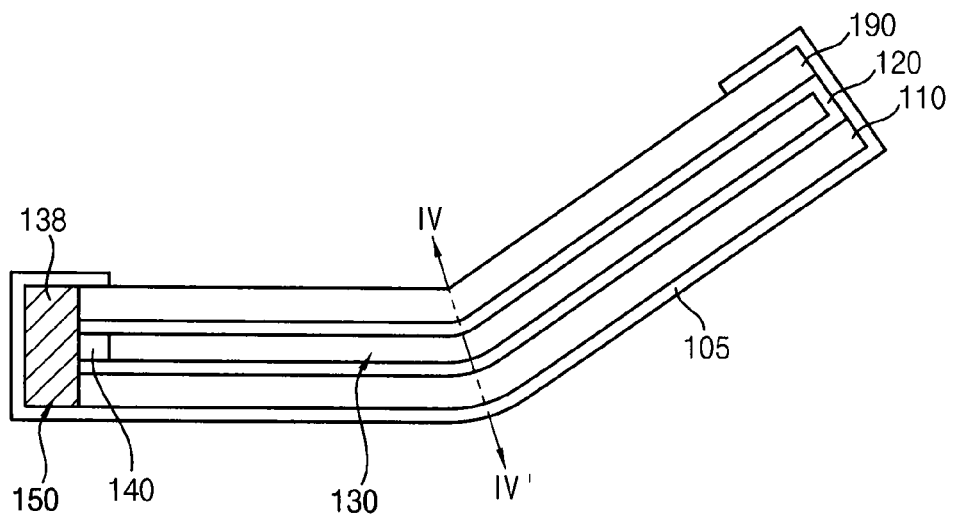

FIGS. 3 and 4 are cross-sectional views illustrating an operating method of a flexible display apparatus in accordance with the invention. FIG. 3 is a cross-sectional view illustrating an operating method of a flexible display apparatus when the flexible display apparatus is unfolded and in an unfolded state. FIG. 4 is a cross-sectional view illustrating an operating method of a flexible display apparatus when the flexible display apparatus is folded and in a bent or deformed state.

Referring to FIG. 3, when the flexible display apparatus is unfolded, the first fluid 138 may be disposed in the first receiving portion 130. The first fluid 138 in the first receiving portion 130 may be at a predetermined pressure, so that the first region I of the display panel 110 supported by the first fluid 138 may be flat. Further, the first fluid 138 may pressurize the first adhesion layer 120, so that bond strengths between the first adhesion layer 120 and the display panel 110 or between the first adhesion layer 120 and the cover substrate 190 may increase. Therefore, the flexible display apparatus may have an improved mechanical strength.

Referring to FIG. 4, when the flexible display apparatus is folded, the first fluid 138 may move into the second receiving portion 150 by actuation of the first pump 140. Therefore, a pressure in the first receiving portion 130 may decrease, and a stress applied to the region adjacent to the folding axis IV-IV' of the display panel 110 may be relieved. That is, the first receiving portion 130 may be an empty space, so that a compression stress or a tensile stress applied to the display panel 110 or the cover substrate 190 may decrease. Further, the second receiving portion 150 may be disposed not to overlap the folding axis IV-IV', so that an increased pressure in the second receiving portion 150 may not hinder the folding operation of the flexible display apparatus.

In order to calculate an effect of stress relaxation by the first receiving portion 130, simulations were performed.

In a first simulation with an exemplary embodiment of a flexible display apparatus in accordance with the invention, each of the display panel 110 and the cover substrate 190 is assumed to be a single layer film having a thickness of about 100 micrometers (µm) and including poly-ethylenetelephtalene ("PET"). The display panel 110 and the cover substrate 190 are assumed to be spaced apart from each other by a distance of about 100 µm, and the first fluid 138 is disposed between the display panel 110 and the cover substrate 190. Then, when the structure including the display panel 110, the first fluid 138 and the cover substrate 190 is folded about the folding axis, a stress applied to the display panel 110 is calculated.

In a second simulation with a comparative flexible display apparatus, each of the display panel 110 and the cover substrate 190 is assumed to be a single layer film having a thickness of about 100 µm and including PET. The display panel 110 and the cover substrate 190 are assumed to be spaced apart from each other by a distance of about 100 µm, and the first adhesion layer 120 is disposed between the display panel 110 and the cover substrate 190. The first adhesion layer 120 is assumed to have strength of about 300 megapascals (MPa) and a viscosity of about 0.3. Then, when the structure including the display panel 110, the first adhesive 120 and the cover substrate 190 is folded about the folding axis, a stress applied to the display panel 110 is calculated.

According to the simulation results, when the structure is folded by about 90 degrees, the stress calculated in the first simulation may be in a range of about 55.4% to about 59.2% of the stress calculated in the second simulation. Further, when the structure is folded by about 160 degrees, the stress calculated in the first simulation may be in a range of about 41.9% to about 47.8% of the stress calculated in the second simulation. That is, when the first fluid 138 is disposed between the display panel 110 and the cover substrate 190, the interfaces of the display panel 110 and the cover substrate 190 are separated, and the stress is relieved.

Figure 5:
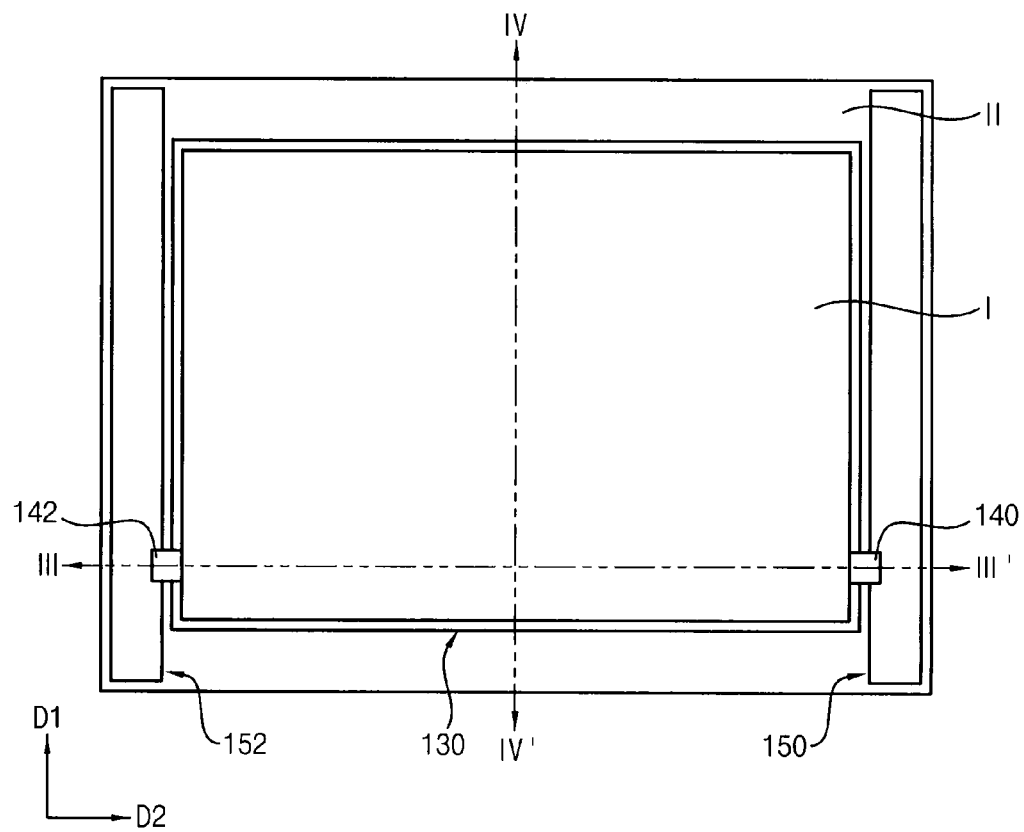
FIG. 5 is a plan view illustrating another exemplary embodiment of a flexible display apparatus in accordance with the invention.
Figure 6:
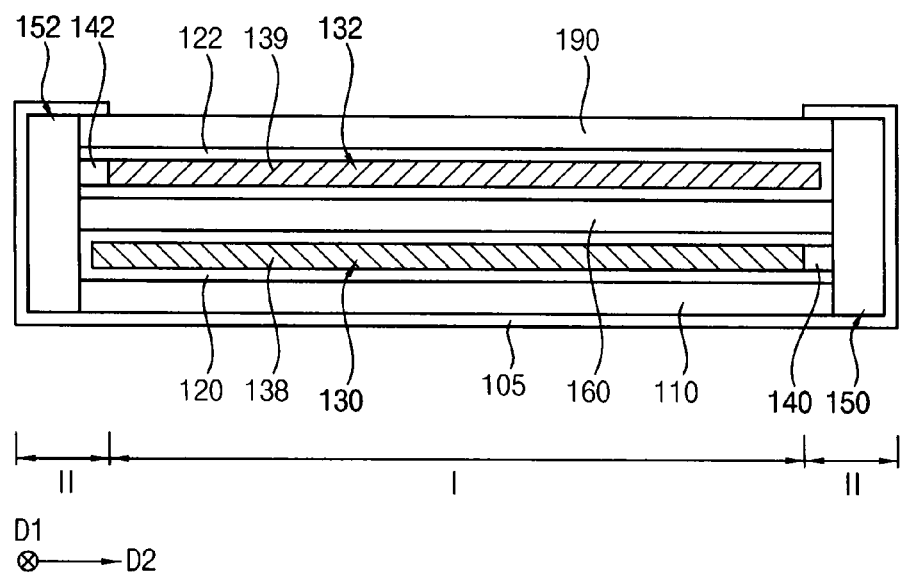
FIG. 6 is a cross-sectional view taken along line III-III' in FIG. 5.

FIG. 5 is a plan view illustrating another exemplary embodiment of a flexible display apparatus in accordance with the invention, and FIG. 6 is a cross-sectional view taken along line III-III' in FIG. 5.

Referring to FIGS. 5 and 6, the flexible display apparatus may include a display panel 110, a touch panel 160, a cover substrate 190, a first adhesion layer 120, a second adhesion layer 122, a first receiving portion 130, a second receiving portion 150, a third receiving portion 132, a fourth receiving portion 152, a first pump 140, a second pump 142 and a frame 105. The display panel 110, the cover substrate 190, the first adhesion layer 120, the first receiving portion 130, the first pump 140, the second receiving portion 150 and the frame 105 may be substantially the same as similar to those described with reference to FIGS. 1 and 2.

The touch panel 160 may be disposed between the display panel 110 and cover substrate 190. The touch panel 160 may be a resistive type, a capacitive type, an electro-magnetic type, a surface acoustic wave ("SAW") type or an infrared type touch panel. In exemplary embodiments, the touch panel 160 may be a capacitive type in which the change of capacity between sensing electrodes is used to detect a touch from the user. In an exemplary embodiment, for example, the touch panel 160 may include the plurality of sensing electrodes and wirings which may be disposed at a single level or at multi levels in a cross-section.

In exemplary embodiments, the touch panel 160 may further include a polarization film. That is, the plurality of sensing electrodes may be disposed on and under the polarization film.

The first adhesion layer 120, the first receiving portion 130 and the first pump 140 may be disposed between the display panel 110 and the touch panel 160. Further, the second adhesion layer 122, the third receiving portion 132 and the second pump 142 may be disposed between the touch panel 160 and the cover substrate 190. The fourth receiving portion 152 may be disposed to overlap the second region II of the display panel 110, and may be fluid-communicated with the third receiving portion 132 through the second pump 142. That is, a second fluid 139 may be located in the third receiving portion 132 or the fourth receiving portion 152 depending on the operation of the flexible display apparatus.

When the flexible display apparatus is unfolded, the first fluid 138 and the second fluid 139 may be disposed in the first receiving portion 130 and the third receiving portion 132, respectively, which overlap the first region I of the display panel 110. Further, when the flexible display apparatus is folded, the first fluid 138 and the second fluid 139 may move into the second receiving portion 150 and the fourth receiving portion 152, respectively. Therefore, pressure in the first receiving portion 130 and the third receiving portion 150 may decrease. That is, when the display panel is folded, the interfaces of the display panel 110, the touch panel 160 and the cover substrate 190 may be separated, so that a stress applied to the display panel 110 may be relieved.

In exemplary embodiment, the flexible display apparatus may include the first pump 140 and the second pump 142. As the number of pumps 140 and 142 increases, the speed of the movement of the first fluid 138 and the second fluid 139 may also increase. The flexible display apparatus is illustrated to include two pumps 140 and 142 in FIGS. 5 and 6. However, the invention is not limited thereto. In an exemplary embodiment, for example, the flexible display panel may include three pumps.

Figure 7:
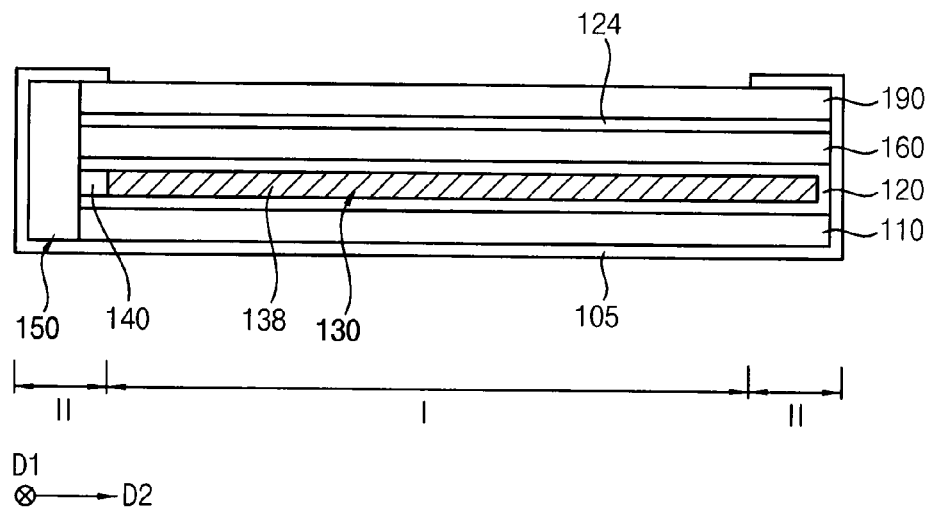
FIG. 7 is a cross-sectional view illustrating still another exemplary embodiment of a flexible display apparatus in accordance with the invention.

FIG. 7 is a cross-sectional view illustrating still another exemplary embodiment of a flexible display apparatus in accordance with the invention.

Referring to FIG. 7, the flexible display apparatus may include a display panel 110, a touch panel 160, a cover substrate 190, a first adhesion layer 120, a second adhesion layer 124, a first receiving portion 130, a second receiving portion 150, a first pump 140 and a frame 105. The flexible display apparatus may be substantially the same as or substantially similar to the flexible display apparatus described with reference to FIGS. 5 and 6 except that the second adhesion layer 124 may not define a receiving portion.

In exemplary embodiments, the first receiving portion 130 and the first pump 140 may be disposed between the display panel 110 and the touch panel 160. However, the invention is not limited thereto. In an exemplary embodiment, for example, the first receiving portion 130 and the first pump 140 may be disposed between the touch panel 160 and the cover substrate 190, with the second adhesion layer 124 between the display panel 110 and the touch panel 160.

The positions of the first receiving portion 130 and the first pump 140 may be determined in the light of the folding direction of the flexible display apparatus. In an exemplary embodiment, for example, when the flexible display apparatus is folded in the folding direction as illustrated in FIG. 4, a tensile stress may be applied to the display panel 110, and a compression stress may be applied to the cover substrate 190. Considering the mechanical reliability of the display apparatus, the relaxation of the tensile stress may be preferred than the relaxation of the compression stress. The tensile stress applied to the display panel 110 may be effectively relieved, when the first receiving portion 130 and the first pump 140 are disposed between the touch panel 160 and the display panel 110, as compared with the case that the first receiving portion 130 and the first pump 140 are disposed between the touch panel 160 and the cover substrate 190.

Figure 8:
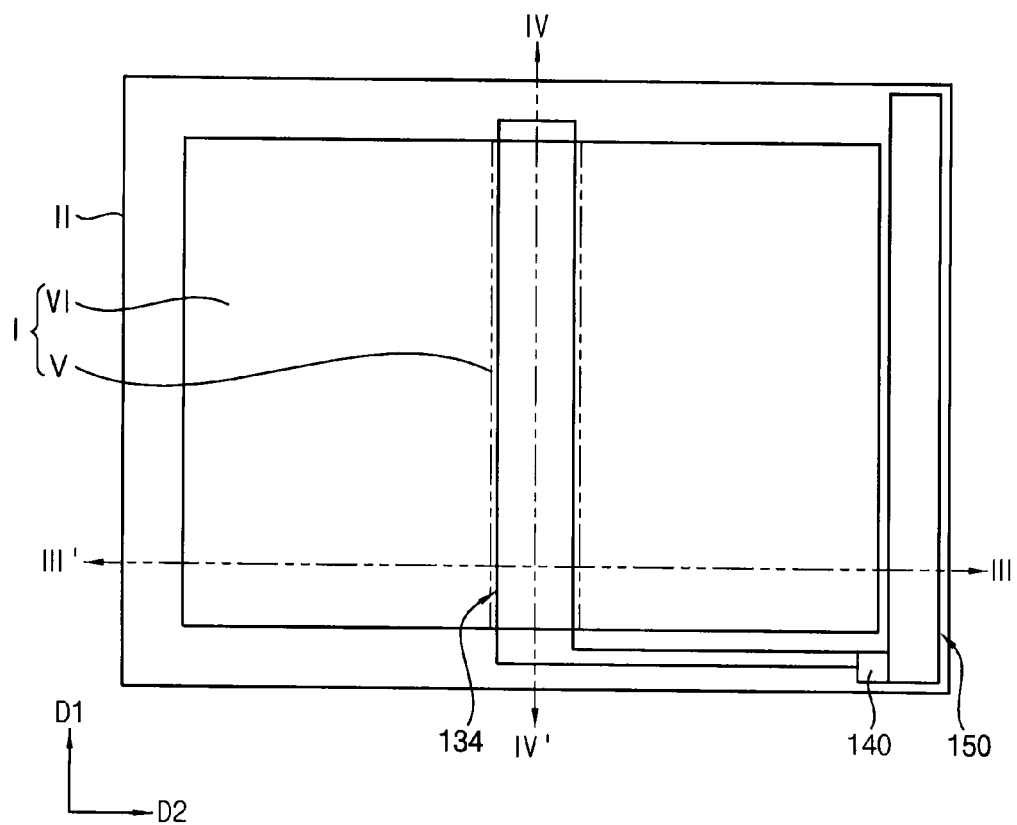
FIG. 8 is a plan view illustrating yet another exemplary embodiment of a flexible display apparatus in accordance with the invention.
Figure 9:
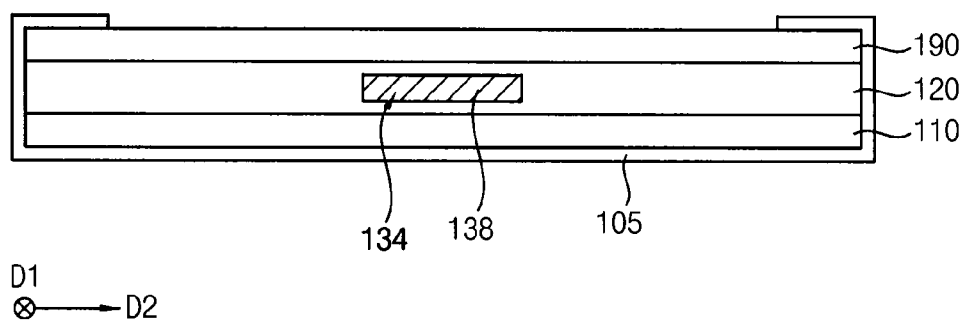
FIG. 9 is a cross-sectional view taken along line III-III' in FIG. 8.

FIG. 8 is a plan view illustrating yet another exemplary embodiment of a flexible display apparatus in accordance with the invention, and FIG. 9 is a cross-sectional view taken along line III-III' in FIG. 8.

Referring to FIGS. 8 and 9, the flexible display apparatus may be substantially the same as or substantially similar to the flexible display apparatus described with reference to FIGS. 5 and 6.

The display panel 110 may be divided into a first region I for display pixels, and a second region II surrounding at least one sides of the first region I. Further, the first region I may be divide into a third region V adjacent to and overlapping a folding axis IV-IV', and a fourth region VI spaced apart from and not overlapping the folding axis IV-IV'. That is, the third region V may be a folding region in which a stress may be applied, when the flexible display apparatus is folded. In contrast, the fourth region VI may be a flat region in which a stress may not be applied, when the flexible display apparatus is folded.

In exemplary embodiments, the flexible display apparatus may include single folding region V which may correspond to single folding axis IV-IV' in FIGS. 8 and 9, however, the invention is not limited thereto. In an exemplary embodiment, for example, the flexible display panel may include several folding regions which may respectively correspond to several folding axes extending in different directions.

In an exemplary embodiment, the first receiving portion 134 may be disposed to overlap the third region V of the display panel 110, and not to overlap the fourth region VI of the display panel 110. Further, the first receiving portion 134 may be fluid-communicated with the second receiving portion 150 through a first pump 140. The first receiving portion 134 may have a volume smaller than that of the first receiving portion 130 described with reference to FIGS. 1 and 2. Therefore, moving a first fluid 138 between the first receiving portion 134 and the second receiving portion 150 may take less time.

According to exemplary embodiments, the first receiving portion 134 may be disposed adjacent to the folding axis IV-IV', so that the first receiving portion 134 may effectively relieve a stress, when the flexible display apparatus is folded.

Figure 10:
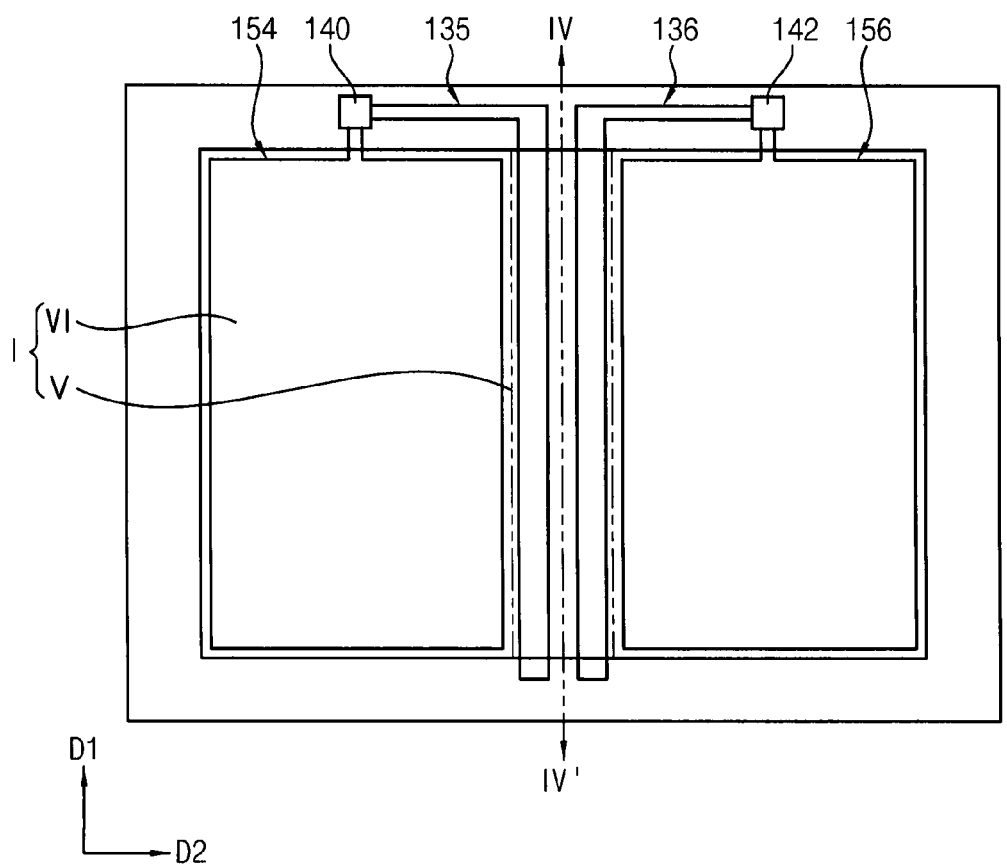
FIG. 10 is a plan view illustrating yet another exemplary embodiment of a flexible display apparatus in accordance with the invention.

FIG. 10 is a plan view illustrating yet another exemplary embodiment of a flexible display apparatus in accordance with the invention.

Referring to FIG. 10, the flexible display apparatus may include a display panel 110, a touch panel 160, a cover substrate 190, a first adhesion layer 120, a first receiving portion 135, a second receiving portion 154, a third receiving portion 136, a fourth receiving portion 156, a first pump 140, a second pump 142 and a frame 105. The flexible display apparatus may be substantially the same as or substantially similar to the flexible display apparatus described with reference to FIGS. 8 and 9 except for the second receiving portion 154, the third receiving portion 136 and the fourth receiving portion 156.

The display panel 110 may be divided into a first region I for display pixels, and a second region II surrounding at least one side of the first region I. Further, the first region I may be divide into a third region V adjacent to and overlapping a folding axis IV-IV', and a fourth region VI spaced apart from and not overlapping the folding axis IV-IV'.

In exemplary embodiments, the first receiving portion 135 and the third receiving portion 136 may be disposed to overlap the third region V of the display panel 110, and may be disposed not to overlap the fourth region VI of the display panel 110. Further, the first receiving portion 135 and the third receiving portion 136 may be fluid-communicated with the second receiving portion 154 and the fourth receiving portion 156 respectively, through the first pump 140 and the second pump 142 in the second region II.

When the flexible display apparatus is folded, a fluid may be respectively disposed in the second receiving portion 154 and the fourth receiving portion 156. The second receiving portion 154 and the fourth receiving portion 156 may be disposed not to overlap the third region V of the display panel 110, so that the fluid in the second receiving portion 154 and the fourth receiving portion 156 may not hinder the folding operation of the flexible display apparatus. Further, the first receiving portion 135 and the third receiving portion 136 may relieve the stress applied to the flexible display apparatus.

Figure 11:
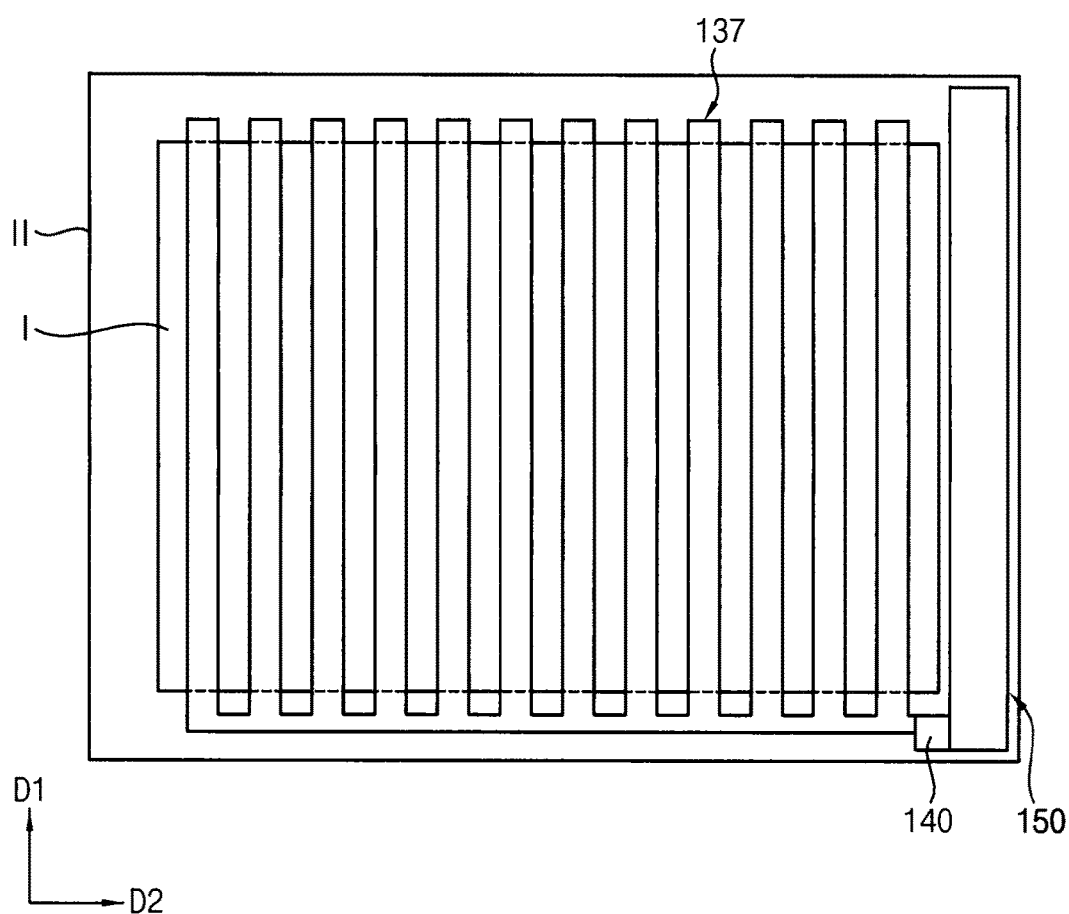
FIG. 11 is a plan view illustrating yet another exemplary embodiment of a flexible display apparatus in accordance with the invention.

FIG. 11 is a plan view illustrating yet another exemplary embodiment of a flexible display apparatus in accordance with the invention.

Referring to FIG. 11, the flexible display apparatus may be substantially the same as or substantially similar to the flexible display apparatus described with reference to FIG. 1 except for the first receiving portion 137.

The first receiving portion 137 may have a comb shape in which a plurality of teeth-like protruding portions extends in a first direction. The protruding portions may be parallel to each other, but the invention is not limited thereto. Therefore, when the flexible display apparatus is folded or even rolled, the first receiving portion 137 may relieve a stress applied to the flexible display apparatus.

Figure 12:
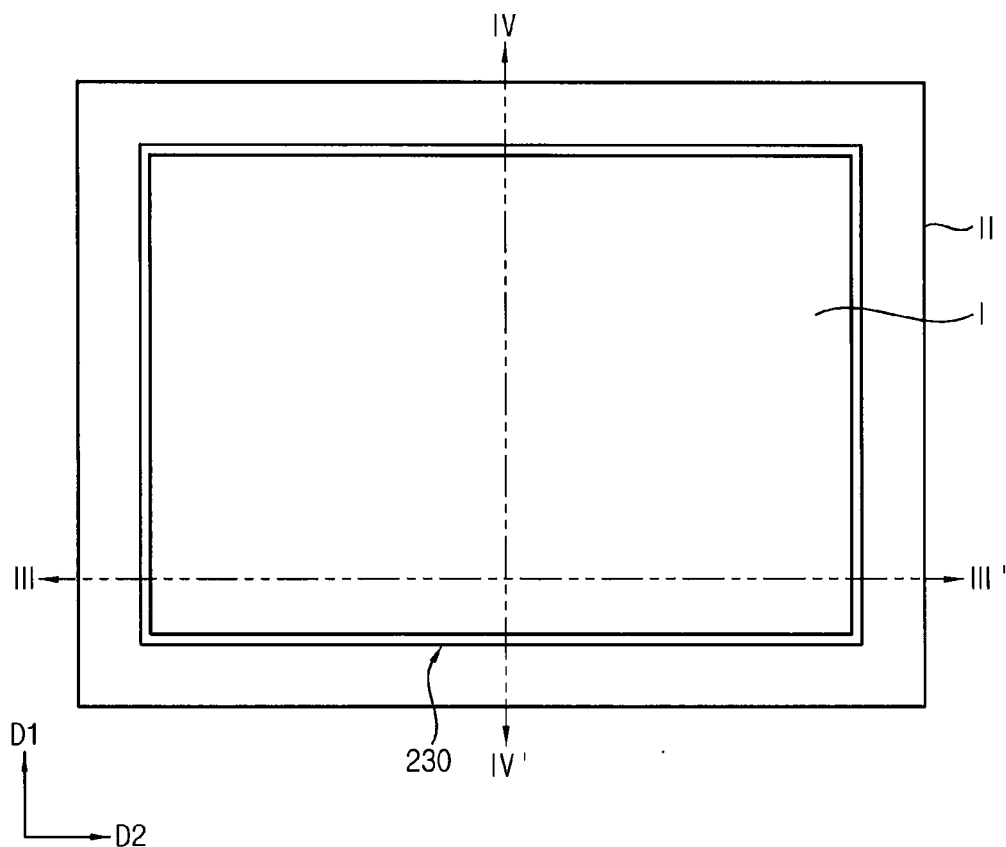
FIG. 12 is a plan view illustrating yet another exemplary embodiment of a flexible display apparatus in accordance with the invention.
Figure 13:
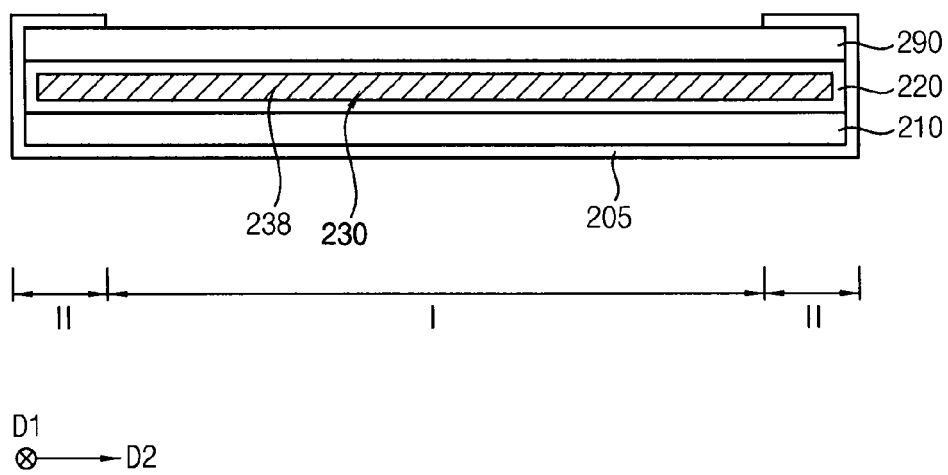
FIG. 13 is a cross-sectional view taken along line III-III' in FIG. 12.

FIG. 12 is a plan view illustrating yet another exemplary embodiment of a flexible display apparatus in accordance with the invention, and FIG. 13 is a cross-sectional view taken along line III-III' in FIG. 12.

Referring to FIGS. 12 and 13, the flexible display apparatus may include a display panel 210, a cover substrate 290, a first adhesion layer 220, a first receiving portion 230 and a frame 205.

The display panel 210 may include a flexible flat display panel having a predetermined flexibility. The display panel 210 may be bent or deformed depending on external forces applied thereto such as from the user. Further, the display panel 210 may be divided in a first region I, and a second region II surrounding at least one side of the first region I.

The cover substrate 290 may be disposed over the display panel 210 to cover (e.g., overlap) an emission face of the display panel 210.

The first adhesion layer 220 may be disposed between the display panel 210 and the cover substrate 290. Further, a space in the first adhesion layer 220 may be defined as a first receiving portion 230. That is, portions of the first adhesion layer 220 may sufficiently surround the first receiving portion 230 and define the first receiving portion 230.

The first receiving portion 230 may be disposed between the display panel 210 and the cover substrate 290. In exemplary embodiments, the first receiving portion 230 may be disposed to overlap the first region I of the display panel 210.

A first fluid 238 may be disposed in the first receiving portion 230. In exemplary embodiments, the first fluid 238 may include a smart fluid. The smart fluid may be capable of changing viscosity depending on an electric field or a magnetic field applied thereto. In an exemplary embodiment, for example, the first fluid 138 may include a magnetic fluid, a magneto-rheological ("MR") fluid, or an electro-rheological ("ER") fluid.

Therefore, the first fluid 238 may have a first viscosity such as for a liquid state, when the electric field or the magnetic field is not applied to the first fluid 238. When the electric field or the magnetic field is applied to the first fluid 238, the first fluid 238 may have a second viscosity, such as for a solid state, which may be higher than the first viscosity. When the first fluid 238 has the second viscosity, the first fluid 238 may support the display panel 210, so that the flexible display apparatus may remain in a flat shape. Further, the first fluid 238 may pressurize the first adhesion layer 220, so that bond strengths between the first adhesion layer 220 and the display panel 210 or between the first adhesion layer 220 and the cover substrate 290 may increase. Therefore, the flexible display apparatus may have an improved mechanical strength.

When the flexible display apparatus is folded or rolled, the electric field or a magnetic field may not be applied to the first fluid 238. Therefore, the first fluid 238 may have the first viscosity, and the first fluid 238 may not support the display panel 210. Accordingly, the first fluid 238 may relieve the stress applied to the display panel 210 and the cover substrate 290, when the flexible display apparatus is folded or rolled.

Further, the electric field or a magnetic field applied to the first fluid 238 may be controlled by electrodes (not shown) disposed in the display panel 210. In an exemplary embodiment, a portion of the pixel electrodes or a portion of the common electrodes of the display panel 210, which do not transfer electrical signals for displaying images, may apply the electric field or the magnetic field to the first fluid 238. In other exemplary embodiments, a portion of the sensing electrodes in a touch panel of the flexible display apparatus may apply the electric field or the magnetic field to the first fluid 238.

Figure 14:
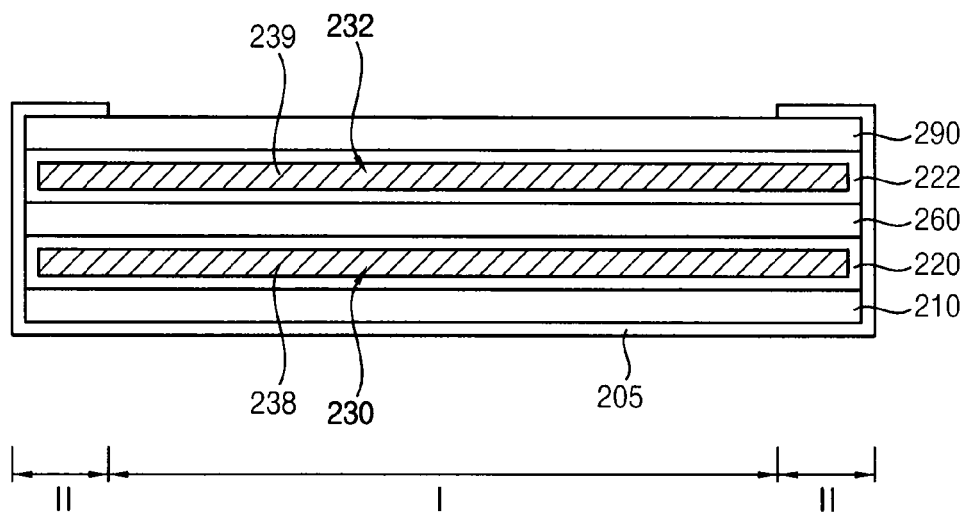
FIG. 14 is a cross-sectional view illustrating yet another exemplary embodiment of a flexible display apparatus in accordance with the invention.

FIG. 14 is a cross-sectional view illustrating yet another exemplary embodiment of a flexible display apparatus in accordance with the invention.

Referring to FIG. 14, the flexible display panel may include a display panel 210, a touch panel 260, a cover substrate 290, a first adhesion layer 220, a second adhesion layer 222, a first receiving portion 230, a second receiving portion 232, a first fluid 238, a second fluid 239 and a frame 205.

The touch panel 260 may be disposed between the display panel 210 and the cover substrate 290. Further, the first adhesion layer 220, the first receiving portion 230 and the first fluid 238 may be disposed between the display panel 210 and the touch panel 260, and the second adhesion layer 222, the second receiving portion 232 and the second fluid 239 may be disposed between the touch panel 260 and the cover substrate 290.

In exemplary embodiments, the sensing electrodes in the touch panel 260 may apply an electric field or a magnetic field to the first fluid 238 and the second fluid 239. The first fluid 238 and the second fluid 239 may be smart fluids, so that viscosities of the first fluid 238 and the second fluid 239 are changeable.

Figure 15:
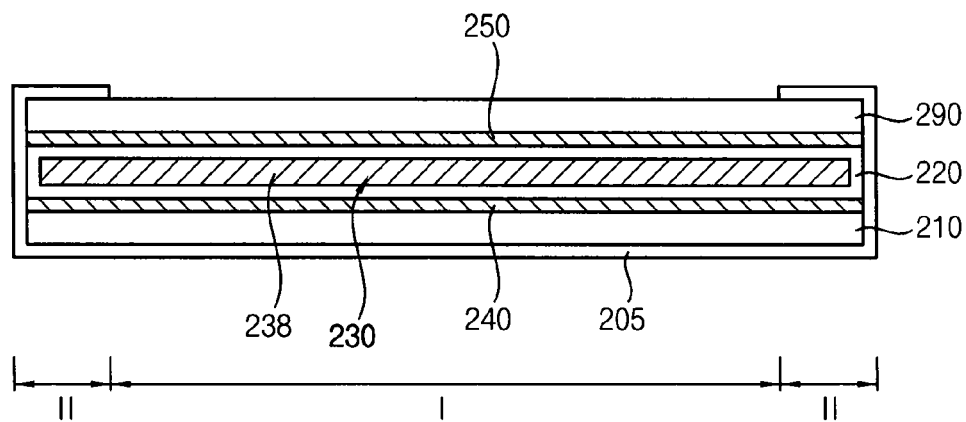
FIG. 15 is a cross-sectional view illustrating yet another exemplary embodiment of a flexible display apparatus in accordance with the invention.

FIG. 15 is a cross-sectional view illustrating yet another exemplary embodiment of a flexible display apparatus in accordance with the invention.

Referring to FIG. 15, the flexible display apparatus may include a display panel 210, a cover substrate 290, a first adhesion layer 220, a first receiving portion 230, a frame 205, a first electrode 240 and a second electrode 250. The flexible display apparatus may be substantially the same as or similar to the flexible display apparatus described with reference to FIGS. 12 and 13 except for the first electrode 240 and the second electrode 250.

In exemplary embodiments, the first electrode 240 may be disposed between the first adhesion layer 220 and the display panel 210, and the second electrode 250 may be disposed between the first adhesion layer 220 and the cover substrate 290. In other exemplary embodiments, one of the first electrode 240 and the second electrode 250 may be omitted.

The first electrode 240 and/or the second electrode 250 may apply an electric field or a magnetic field to a first fluid 238. When the flexible display apparatus is unfolded, the first electrode 240 and/or the second electrode 250 may apply the electric field or the magnetic field to the first fluid 238 such that a viscosity of the first fluid 238 may increase. The first fluid 238 may effectively support the flexible display apparatus. When the flexible display apparatus is folded, the first electrode 240 and/or the second electrode 250 may not apply the electric field or the magnetic field to the first fluid 238 such that a viscosity of the first fluid 238 may decrease. The first fluid 238 may not hinder the folding operation of the flexible display apparatus.

Figure 16:
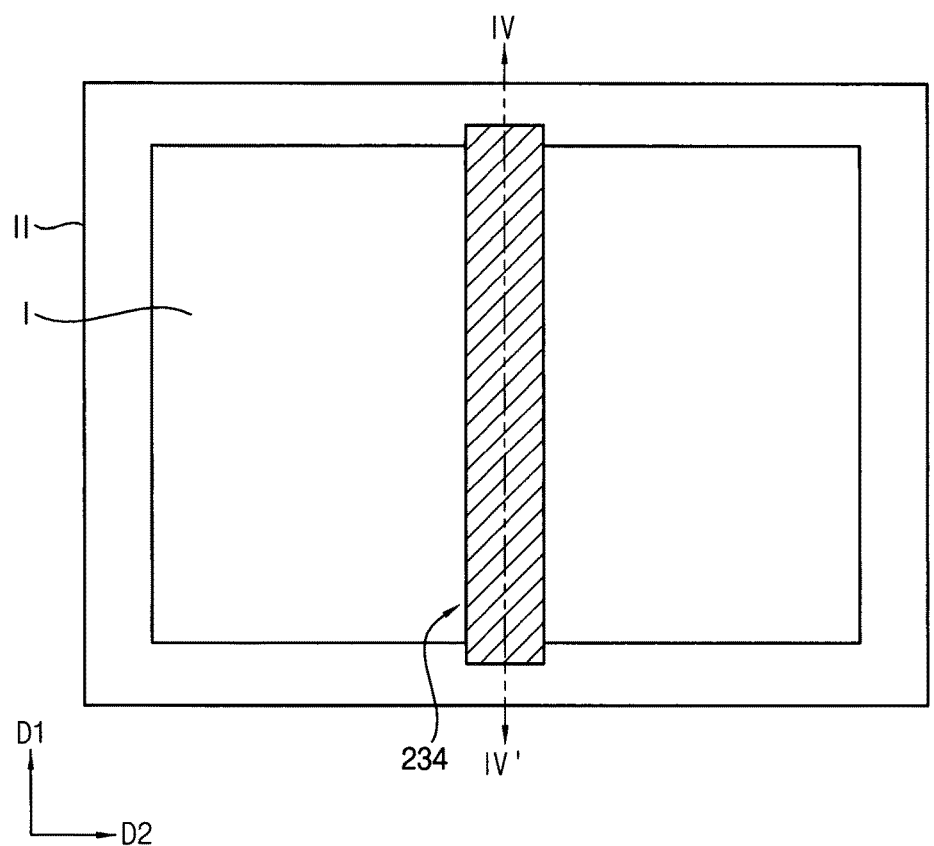
FIG. 16 is a plan view illustrating yet another exemplary embodiment of a flexible display apparatus in accordance with the invention.

FIG. 16 is a plan view illustrating yet another exemplary embodiment of a flexible display apparatus in accordance with the invention. The flexible display apparatus may be substantially the same as or substantially similar to the flexible display apparatus described with reference to FIGS. 12 and 13 except for the first receiving portion 234.

In exemplary embodiments, the first receiving portion 234 may be disposed adjacent to a folding axis IV-IV'. That is, the first receiving portion 234 may correspond to the folding axis IV-IV'.

Figure 17:
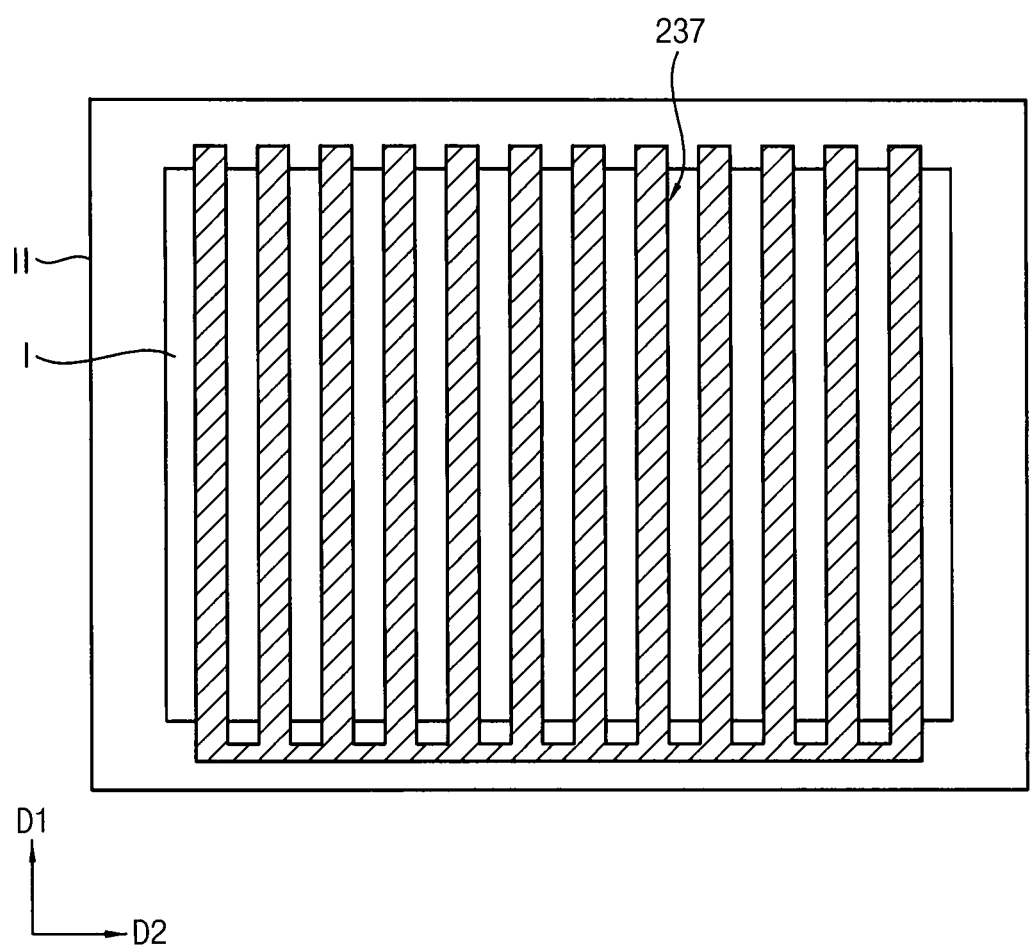
FIG. 17 is a plan view illustrating yet another exemplary embodiment of a flexible display apparatus in accordance with the invention.

FIG. 17 is a plan view illustrating yet another exemplary embodiment of a flexible display apparatus in accordance with the invention. The flexible display apparatus may be substantially the same as or substantially similar to the flexible display apparatus described with reference to FIGS. 12 and 13 except for the first receiving portion 237.

In exemplary embodiments, the first receiving portion 237 may have a comb shape in which may have a plurality of teeth-like protruding portions extends in a first direction. Therefore, when the flexible display apparatus is rolled, a smart fluid in the first receiving portion 237 may relieve a stress applied to the flexible display apparatus. That is, the flexible display apparatus may be a rollable display apparatus.

The foregoing is illustrative of exemplary embodiments, and is not to be construed as limiting thereof Although a few exemplary embodiments have been described, those skilled in the art will readily appreciate that many modifications are possible in the exemplary embodiments without materially departing from the novel teachings and advantages of exemplary embodiments. Accordingly, all such modifications are intended to be included within the scope of exemplary embodiments as defined in the claims. In the claims, means-plus-function clauses are intended to cover the structures described herein as performing the recited function and not only structural equivalents but also equivalent structures. Therefore, it is to be understood that the foregoing is illustrative of exemplary embodiments and is not to be construed as limited to the specific exemplary embodiments disclosed, and that modifications to the disclosed exemplary embodiments, as well as other exemplary embodiments, are intended to be included within the scope of the appended claims. The invention is defined by the following claims, with equivalents of the claims to be included therein.

What is claimed is:

1. A flexible display apparatus, comprising:
   a display panel comprising a first region in which an image is displayed, and a second region adjacent to a side of the first region and in which an image is not displayed;
   a cover substrate overlapping the display panel;
   a first receiving space portion defined between the display panel and the cover substrate, the first receiving space portion overlapping the first region of the display panel; and
   a first fluid for which a location thereof relative to the first receiving space portion is changed according to a bent state of the flexible display apparatus,
   wherein
      for a folded state of the flexible display apparatus, the first fluid is transferred out of the first receiving space portion, and
      for an unfolded state of the flexible display apparatus, the first fluid is disposed in the first receiving space portion.

2. The flexible display apparatus of claim 1, further comprising
   a second receiving space portion defined therein; and
   a pump between the first receiving space portion and the second receiving space portion, such that the first receiving space portion is fluid-communicated with the second receiving space portion via the pump.

3. The flexible display apparatus of claim 2, wherein the pump controls a movement of the first fluid between the first receiving space portion and the second receiving space portion.

4. The flexible display apparatus of claim 2, wherein
   for the unfolded state of the flexible display apparatus, the pump transfers the first fluid from the second receiving space portion to the first receiving space portion, and
   for the folded state of the flexible display apparatus, the pump transfers the first fluid from the first receiving space portion to the second receiving space portion.

5. The flexible display apparatus of claim 2, wherein in the unfolded state of the flexible display apparatus, the pump controls a pressure of the first fluid in the first receiving space portion.

6. The flexible display apparatus of claim 2, wherein the second receiving space portion overlaps the second region of the display panel.

7. The flexible display apparatus of claim 2, wherein the first fluid has a dielectric constant in a range from about 1.45 to about 1.55.

8. The flexible display apparatus of claim 1, further comprising:
   a touch panel between the first receiving space portion and the cover substrate;
   a third receiving space portion defined between the touch panel and the cover substrate, the third receiving space portion overlapping the first region of the display panel; and
   a second fluid in the third receiving space portion.

9. The flexible display apparatus of claim 1, further comprising a folding axis about which the flexible display apparatus is bendable,
   wherein the first receiving space portion overlaps the folding axis.

10. The flexible display apparatus of claim 9, wherein
   the first region of the display panel is divided into a third region adjacent to the folding axis and a fourth region spaced apart from the folding axis, and the first receiving space portion overlaps the third region of the display panel and exposes the fourth region of the display panel.

11. The flexible display apparatus of claim 10, further comprising:
a second receiving space portion defined therein; and
a pump between the first receiving space portion and the second receiving space portion, such that the first receiving space portion is fluid-communicated with the second receiving space portion via the pump,
wherein the second receiving space portion overlaps the fourth region of the display panel and exposes the third region of the display panel.

12. The flexible display apparatus of claim 1, further comprising a folding axis extended in a first direction and about which the flexible display apparatus is bendable,
wherein the first receiving space portion has a comb shape having a plurality of protruding portions extending in the first direction and overlapping the first region of the display panel.

13. The flexible display apparatus of claim 1, further comprising an adhesion layer between the display panel and the cover substrate,
wherein the adhesion layer defines the first receiving space portion.

14. A flexible display apparatus comprising:
a display panel comprising an emission face, a first region in which an image is displayed, and a second region adjacent to a side of the first region and in which an image is not displayed;
a cover substrate covering the emission face the display panel;
a first receiving space portion defined between the emission face of the display panel and the cover substrate, the first receiving space portion overlapping the first region of the display panel; and
a smart fluid which is in the first receiving space portion defined between the emission face of the display panel and the cover substrate and for which a viscosity thereof is changeable depending on an electric field or a magnetic field applied thereto,
wherein
in an unfolded state of the flexible display apparatus, the smart fluid has a first viscosity, and
in a folded state of the flexible display apparatus, the smart fluid has a second viscosity lower than the first viscosity.

15. The flexible display apparatus of claim 14, wherein the smart fluid comprises a magnetic fluid, a magneto-rheological fluid or an electro-rheological fluid.

16. The flexible display apparatus of claim 14, further comprising an electrode between the first receiving space portion and the emission face of the display panel or between the first receiving space portion and the cover substrate,
wherein the electrode is configured to apply the electric field or the magnetic field to the smart fluid based on the unfolded state or the folded state of the flexible display apparatus.

17. The flexible display apparatus of claim 14, further comprising a touch panel between the display panel and the first receiving space portion.

18. The flexible display apparatus of claim 17, wherein the touch panel comprises a plurality of sensing electrodes configured to apply the electric field or the magnetic field to the smart fluid based on the unfolded state or the folded state of the flexible display apparatus.

19. The flexible display apparatus of claim 14, further comprising a folding axis about which the flexible display apparatus is bendable,
wherein
the folding axis is disposed in the first region of the display panel in which the image is displayed, and
the smart fluid which is in the first receiving space portion defined between the emission face of the display panel and the cover substrate is disposed in the first region of the display panel to overlap the folding axis and extends from the first region to be disposed in the second region of the display panel in which an image is not displayed.

* * * * *